(12) United States Patent
Chu et al.

(10) Patent No.: US 6,421,784 B1
(45) Date of Patent: Jul. 16, 2002

(54) PROGRAMMABLE DELAY CIRCUIT HAVING A FINE DELAY ELEMENT SELECTIVELY RECEIVES INPUT SIGNAL AND OUTPUT SIGNAL OF COARSE DELAY ELEMENT

(75) Inventors: Albert Manhee Chu, Essex, VT (US); Daniel Mark Dreps, Georgetown, TX (US); Frank David Ferraiolo, Essex, VT (US); Kevin Charles Gower, LaGrangeville; Roger Paul Gregor, Endicott, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/263,671

(22) Filed: Mar. 5, 1999

(51) Int. Cl.[7] .............................. G06F 1/12; G06F 13/42
(52) U.S. Cl. ....................................... 713/401; 327/276
(58) Field of Search ................................ 713/401, 501, 713/502, 600; 327/276, 277

(56) References Cited

U.S. PATENT DOCUMENTS

| | | | | |
|---|---|---|---|---|
| 4,657,406 A | * | 4/1987 | Yaeda | 368/120 |
| 5,086,500 A | * | 2/1992 | Greub | 713/401 |
| 5,293,626 A | * | 3/1994 | Priest et al. | 713/401 |
| 5,463,337 A | | 10/1995 | Leonowich | |
| 5,544,203 A | | 8/1996 | Casasanta et al. | |
| 5,552,726 A | * | 9/1996 | Wichman et al. | 327/149 |
| 5,737,767 A | | 4/1998 | Agrawal et al. | |
| 5,777,504 A | | 7/1998 | Chu et al. | |
| 6,075,415 A | * | 6/2000 | Milton et al. | 331/25 |
| 6,166,573 A | * | 12/2000 | Moore et al. | 327/161 |
| 6,229,367 B1 | * | 5/2001 | Choudhury | 327/276 |

FOREIGN PATENT DOCUMENTS

| | | |
|---|---|---|
| JP | 3-035613 | 2/1991 |
| JP | 3-130678 | 6/1991 |

* cited by examiner

Primary Examiner—Thomas Lee
Assistant Examiner—Thuan Du
(74) Attorney, Agent, or Firm—Winstead Sechrest & Minick P.C.; Anthony V. S. England

(57) ABSTRACT

A programmable delay element having a fine delay circuit with fractional units of delay. The fine delay circuit has a fine delay circuit with a plurality of selectable delay paths, each delay path having an associated delay interval. The fine delay element is electrically-coupled to a data terminal for receiving and delaying an input signal. A control circuit is electrically-coupled to the fine delay circuit to select the delay path for the input signal. In a further aspect of the invention, the fine delay circuit is electrically-coupled to a coarse delay circuit having a plurality of selectable delay blocks in a repetitive block configuration. The coarse delay circuit is electrically-coupled to a second data terminal for receiving and inserting a second signal through said fine delay circuit. The control circuit is electrically-coupled to the selective delay path of the fine delay circuit and the coarse delay circuit such that either a fine delay, a coarse delay, or a coarse and a fine delay can be selected.

27 Claims, 7 Drawing Sheets

US 6,421,784 B1

PROGRAMMABLE DELAY CIRCUIT HAVING A FINE DELAY ELEMENT SELECTIVELY RECEIVES INPUT SIGNAL AND OUTPUT SIGNAL OF COARSE DELAY ELEMENT

TECHNICAL FIELD

The present invention relates generally to signal delay devices, and in particular to digital delay elements that are incrementally-adjustable for use with computer system components.

BACKGROUND INFORMATION

As the operation speed of computer systems continues to increase, the need exists to delay either clock or data signals to optimize the critical timing within the computer system due to the timing requirements of system components. Certainly, as the clock rate in the system increases, timing between the computer elements and within the computer chips becomes critical. One method to control the timing has been with a delay elements controllable through a digital Delay Locked Loop ("DLL"). These devices have been typically limited to coarse variable-delays where the incremental delay unit is one or two logic gates providing one or two block delay units, accordingly.

A design consideration for a delay element is its delay resolution and its insertion delay. The delay resolution is the unit of delay available through a delay element. Conventional delay circuits with block unit delays may be acceptable for low frequency operation, but high performance circuits require fractional increments of block delays. Insertion delay is the amount of delay generated by a delay element when at a zero delay state. The insertion delay is an important consideration particularly when deskewing data, since any added delay in a data path decreases overall performance.

In conventional delay circuitry, it is common-that the insertion delay is substantial and much larger than the minimum increment of increase in delay, as in the delay element illustrated in FIG. 5. The insertion delay is large in this case due to the large number of inputs being multiplexed at the N:1 MUX. For example, the insertion delay may be 2 nanoseconds, while the increment of increase may be 0.2 nanoseconds. Alternatively, the insertion delay may be smaller, and the increment of increase may be of the same magnitude of the insertion delay, as in the delay element illustrated in FIG. 6. However, it is generally the case, for this configuration, that the constituent 2:1 MUX delay elements must be matched in order to reduce signal distortion. Therefore, for the delay element in FIG. 6, if the insertion delay is small and largest selectable delay is to be substantial, a substantial number of delay elements must be included. For example, for the delay element in FIG. 6, if the insertion delay is to be 0.2 nanoseconds, then to achieve a maximum delay of 2.6 nanoseconds would require 13 MUX's.

Accordingly, a need exists for a programmable delay element for high performance computer systems that has greater delay resolution and negligible insertion delay. Also needed is a programmable delay element that does not distort signals passed through the circuit, either at large or small delay values, and is testable with relatively uncomplicated testing techniques.

SUMMARY OF THE INVENTION

The present invention addresses the foregoing needs by providing circuitry for delaying a signal that includes a coarse delay element and a fine delay element. The coarse delay element is coupled to a delay element input node for receiving an input signal, and has an output node for outputting a coarse delay element output signal. The coarse delay element receives at least one control signal for selecting a delay time, the output signal being responsive to the input signal, and delayed with respect to the input signal according to the selected delay time. The fine delay element is coupled to the delay element input node for receiving the input signal, and is coupled to the coarse delay element output node for receiving the output signal from the coarse delay element. The fine delay element has an output node for outputting an output signal. The fine delay element receives at least one control signal for selecting the fine delay element delay time, and an operative input signal, from the delay element input signal and the coarse delay element output signal. The fine delay element output signal is responsive to the operative fine delay element input signal, and delayed with respect to the operative fine delay element input signal according to the selected fine delay element delay time.

A further aspect of the present invention is a method for delaying a signal. The method receives a delay element input signal by a coarse delay element, selects a coarse delay element delay time by at least one coarse delay element control signal, outputs a coarse element output signal by the coarse delay element responsive to the delay element input signal, and delayed with respect to the input signal according to the selected coarse delay element delay time. The method also receives the delay element input signal by a fine delay element, receives the coarse delay element output signal by the fine delay element, selects the delay element input signal or the coarse delay element output signal as an operative fine delay element input signal by at least one fine delay element control signal, selects a fine delay element delay time by at least one fine delay element control signal, and outputs a fine delay element output signal responsive to the operative fine delay element input signal, and delayed with respect to the operative fine delay element input signal according to the selected fine delay element delay time.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
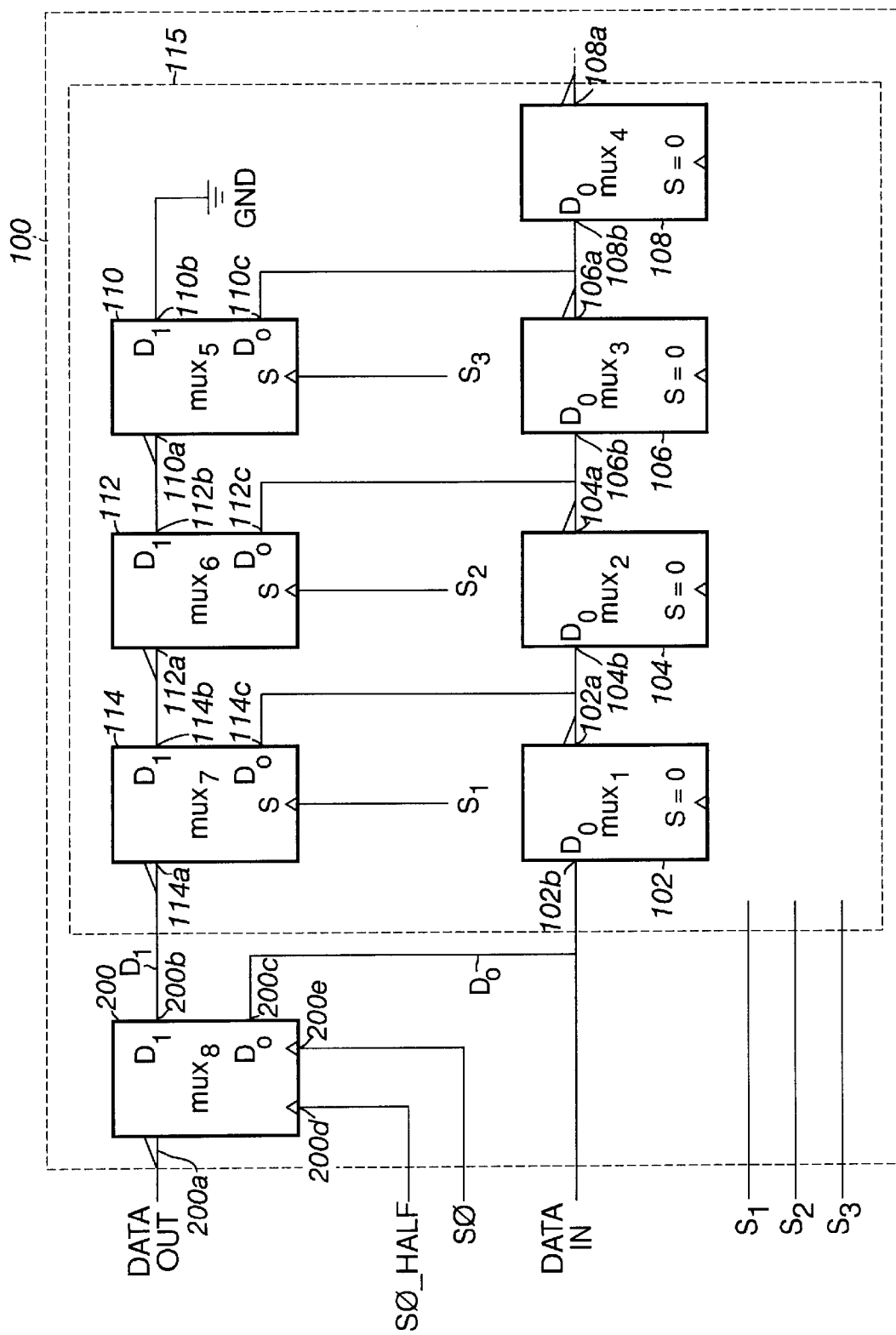
FIG. 1 is a block diagram of a programmable delay element of the present invention.

In the following description, numerous specific details are set forth to provide a thorough understanding of the present invention. It should be noted, however, that those skilled in the art are capable of practicing the present invention without such specific details. In other instances, well-known circuits have been shown in block diagram form in order not to obscure the present invention in unnecessary detail.

Although the present invention is described with reference to a specific embodiment of a delay element providing a delay interval in response to an input code, it should be understood that the programmable delay element of the present invention can be adapted for use with other digital devices having comparable hardware capabilities, and selective circuitry including, by way of example, other combinations of logic gates such as AND gates, NAND gates, and NOR gates having sufficient bandwidth for high-performance computer operations at high-speed clock rates in the Gigahertz range, and have the ability to provide selective fine delays with a suitable delay resolution and a negligible insertion delay. Furthermore, the delay element of the present invention can be adaptable to a both on-chip and off-chip delay circuitry in a computer system. All such variations are intended to be included within the scope of the present invention. It will recognized that, in the drawings, only those signal lines and processor blocks necessary for the operation of the present invention are shown.

Referring to the drawings, depicted elements are not necessarily shown to scale, and like or similar elements are designated by the same reference numeral through the several views.

FIG. 1 is a block diagram of a programmable delay element 100 of the present invention. The delay element 100 has a plurality of inverting delay blocks 102, 104, 106, 108, 110, 112, and 114, which are arranged in a repetitive block configuration to provide a coarse delay element ("CDE") 115. The delay blocks 102, 104, 106, and 108 are grouped to form a DATA_IN signal path, and the delay blocks 110, 112, 114, and 116 are grouped to form a DATA_OUT signal path.

Associated with each of the delay blocks is a known time delay for signal propagation from the input terminal to the output terminal of each respective delay block. According to the embodiment, a delay block is about one-tenth of a cycle of the digital clock signal for a computer system. Each of the delay blocks may be implemented using a combination of multiplexers, inverters, and/or registers. In the present embodiment, multiplexers ("MUXs") are implemented to provide the delay blocks 102, 104, 106, 108, 110, 112, and 114.

A DATA_IN signal is provided to the input terminal 102b of delay block 102. The DATA_IN signal can be a system clock signal, a digital data signal, or other digital signal format that requires a delay interval to interface with other circuits within the same chip or on a separate chip.

Figure 7:
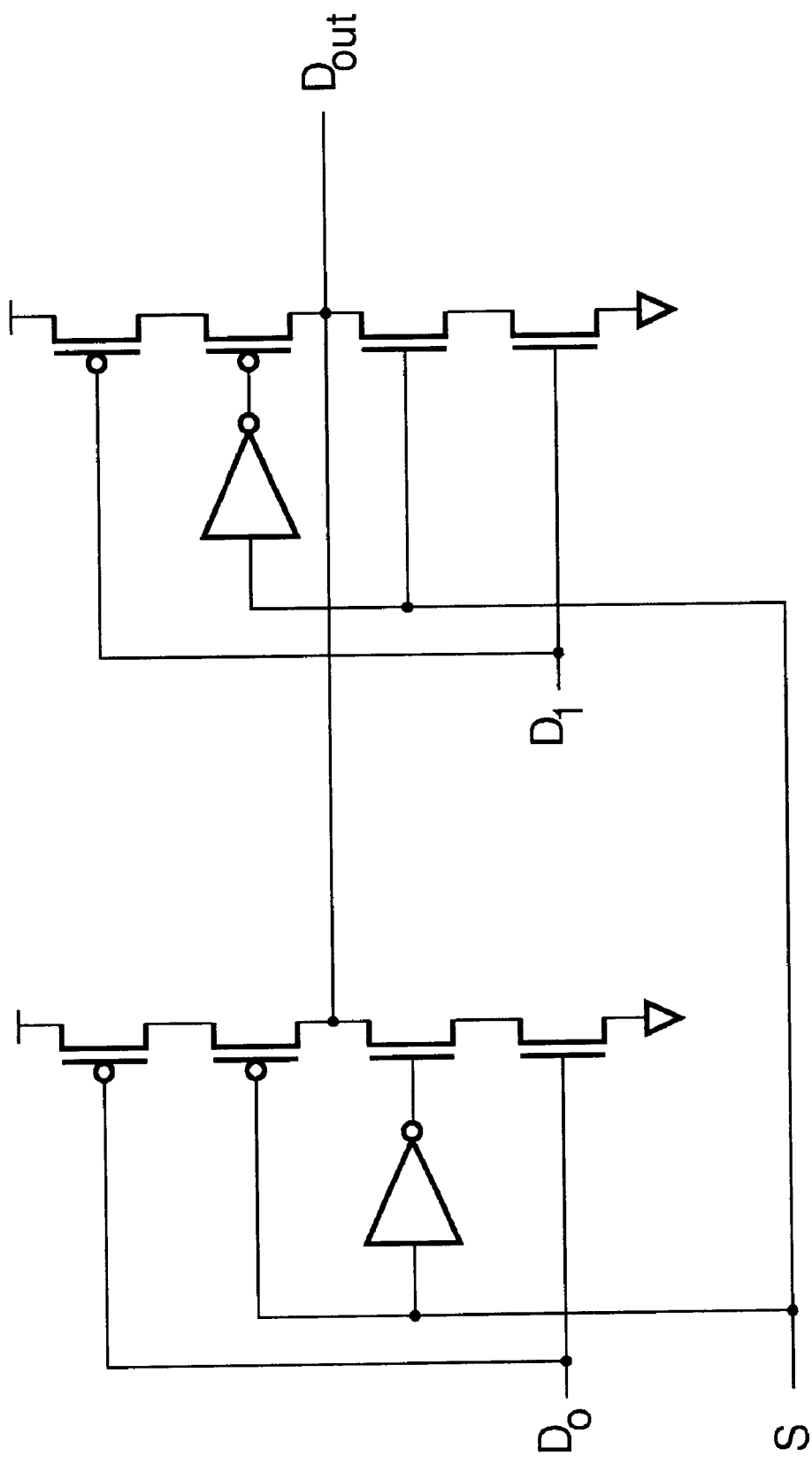
FIG. 7 is a circuit diagram of each of delay elements 102, 104, 106, 108, 110, 112, and 114.

The input signal, DATA_IN, propagates through selected ones of the delay blocks 102, 104, 106, 110, 112, and 114 to the coarse delay element 115 output node, line $D_1$. That is, control signals on lines $S_1$, $S_2$ and $S_3$ select whether the signal propagates through any one or more of delay blocks 102, 104, and 106, or for more delay, through delay blocks 102, 104, 112, and 114, or, for maximum delay, through delay blocks 102, 104, 106, 110, 112, and 114. Note that according to the present embodiment, delay block 108 is not in any of the above-described signal propagation paths. Delay block 108 merely provides symmetry. That is, it provides part of the load on the output of delay block 106, so that delay block 106 has the same load as all of the other delay blocks shown in FIG. 1. Note also that delay blocks 102, 104, and 106 receive only one input, although they are 2:1 multiplexers. Such 2:1 multiplexers are used also for circuit symmetry, and are wired, as shown in FIG. 7, so that their sole respective inputs are always selected.

The term "chip" as used herein is understood to basically be thousands to millions of transistors packed into a small piece of semiconductor substrate that are wired together to perform a specific function. Traditional wiring uses aluminum. In chips made using more advanced technology, they are wired together using copper. The number of transistors on a chip, the speed of each transistor, and the delay passing electricity through each transistor and each transistor's metal interconnect determine how fast the entire chip operates. Three of the most common kind of chips include: microprocessors, memory and logic chips. Microprocessors, the "brains" of a computer or other electronic device, carry out most calculations and operations. Memory chips are used to store data and computer programs that are executed. There are usually two kinds of memory found in a computer: static memory (SRAM), which is fast, but not as dense and dynamic memory (DRAM), which, is slower but much denser. The fourth kind of chip on the computer is a collection of logic chips: these are the chips that control the operation of the "bus" on the computer, the disk drive, and many other operations.

The repetitive block configuration of the programmable delay element 100 is provided by cascading the delay blocks in the DATA_IN signal path and the DATA_OUT signal path. That is, the output terminal 102a of delay block 102 is electrically-coupled to the input terminal 104b and the delay block input terminal 114c; the output terminal 104a of delay block 104 is electrically-coupled to the input terminal 106b and the delay block input terminal 112c; and the output terminal 106a of delay block 106 is electrically-coupled to the input terminal 108b and the delay block input terminal 110c. The output terminal 108a of delay block 108 may be electrically-coupled to additional delay blocks to allow additional delay values.

With respect to the DATA_OUT signal path, the output terminal 110a of delay block 110 is electrically-coupled to an input terminal 112b of delay block 112; and the input terminal 110b is electrically-coupled to a voltage source to otherwise prevent the terminal from floating. As shown, the terminal 110b is tied to a voltage source GND. The output terminal 112a of delay block 112 is electrically-coupled to an input terminal 114b of delay block 114; the output terminal 114a of the delay block 114 is electrically-coupled to an input terminal 200b of the fine delay element ("FDE") 200.

The fine delay element 200 provides a signal output line DATA_OUT from an output terminal 200a. In addition to being electrically-coupled to the input terminal 102b, the DATA_IN signal is also electrically-coupled to the secondary input terminal 200c of the fine delay element 200.

Note that the delay blocks 102, 104, 106, 108, 110, 112, 114, and 200 provide inverted signal outputs. Since the blocks are substantially similar or identical, any signal distortion through one block tends to be similar or identical to signal distortion through another. Furthermore, since each block inverts its respective input signal, this tends to cancel signal distortion introduced by the proceeding block. This enables a high bandwidth design capable of accommodating computer system clock frequencies of at least 1 GigaHertz. It should be noted that the present invention can also be used with slower computer systems to take advantage of the characteristics of the present invention.

Accordingly, the insertion delay—the amount of delay generated at a zero delay state—for the programmable delay element 100 is a fractional unit of a single block of delay, taking an indirect advantage of the high delay resolution of the present invention.

Figure 2A:
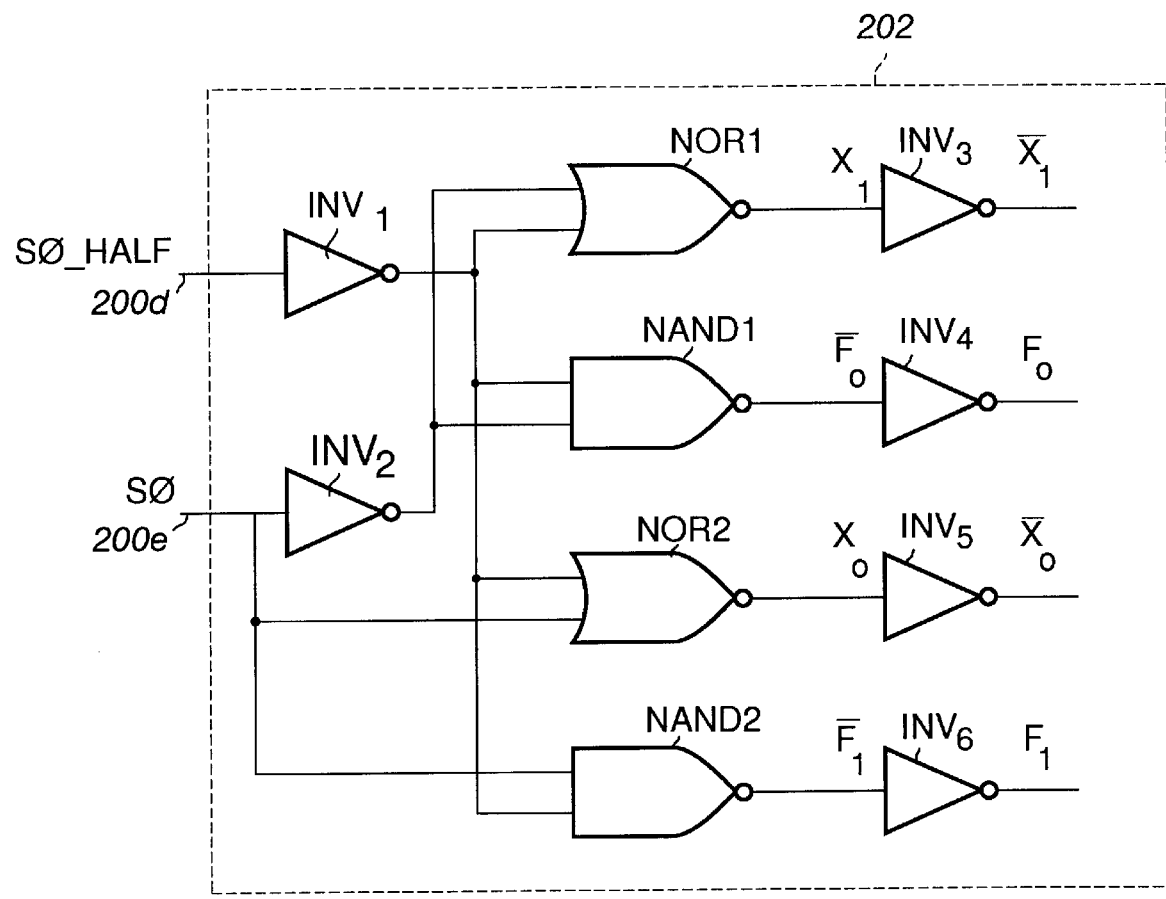
FIGS. 2A–2B are logic and circuit level schematics of the fine delay element of the programmable delay element of the present invention;.
Figure 2B:
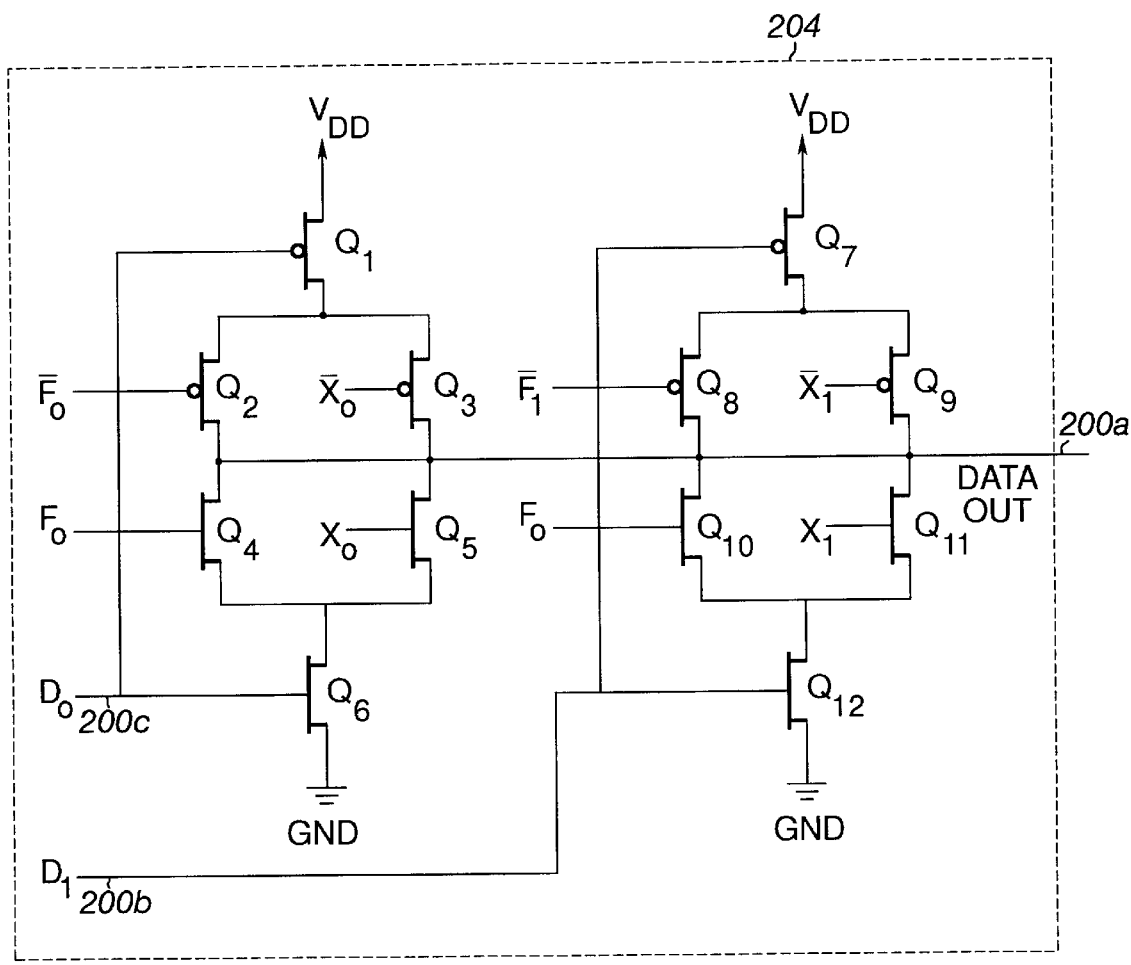

FIGS. 2A and 2B are logic and circuit level schematics of the fine delay element 200 of the programmable delay element 100. The fine delay element 200 has a MUX structure similar to the MUXs used in the delay blocks for the coarse delay circuit 115, but has additional branches and control logic to allow adjustment of the delay through the circuit 200. Accordingly, the resolution of phase adjustment is increased without significantly increasing the number of delay elements in the cumulative delay value provided through the DATA_IN path and the DATA_OUT path.

In FIGS. 2A and 2B, the delay available with the fine delay element 200 is about one-half of a coarse unit of delay (that is, one-half of two 2:1 MUXs). The fine delay element 200 is first chosen and connected to the DATA_OUTPUT signal line through the terminal 200a.

If additional delay is required for the signal input to the input terminal 102b, then the fine unit delay is added to the path. If additional delay is required the fine delays are set to zero and the next coarse delay is added to the path (two 2:1 MUXs) for a total of three delay blocks 102, 114, and 200. In general, the fine delay element 200 can be broken down to smaller fractional units to achieve the desired delay resolution without significantly increasing the overall size and complexity of the fine delay element 200. A single control bus can be employed to control the programmable delay element 100 with the lower order bits controlling the fine resolution and the higher order bits controlling the coarse delay.

Referring to FIG. 2A, shown is the logic control circuitry 202 of the fine delay circuit 200. The circuit has a control terminal 200d to electrically-couple with the S0_HALF signal line, and control terminal 200e to electrically-couple with the S0 signal line. The binary bits provided through the S0_HALF and S0 signal lines are the Least Significant Bits ("LSB") of a binary control word, having sixteen bits, for the programmable delay element 100 (see FIG. 1). Accordingly, the programmable delay circuit can provide either a variable fine delay, a variable coarse delay, or a combinational coarse and a fine delay.

It should be noted that the programmable delay element 100 is programmable through the binary control word, and can be controlled with microprocessor circuitry. Further, it should be readily appreciated that a digital Delay Locked Loop ("DLL"), which is commonly deployed as a phase comparator, may also be used to provide delay feedback. With delay feedback, the delay value for a signal passing through the programmable delay element 100 can be actively controlled.

The S0_HALF signal line is electrically-coupled through an inverter INV1 to the input terminals for logic gates NOR1 and NOR2 and logic gates NAND1 and NAND2. The S0 signal line is electrically-coupled through the inverter INV2 (providing an inverted S0 signal), to the input terminals for the logic gates NOR1 and NAND1. The S0 signal line is electrically-coupled, without a logic inversion to the signal line, to the input terminals for the logic gates NOR2 and NAND2. The output terminals of the logic gates NOR1, NAND1, NOR2, and NAND2, are designated X1, F0, X0, and F1, respectively. The logic associated with the logic control circuit is shown in TABLE 1:

TABLE 1

| Input | | Output | | | |
|---|---|---|---|---|---|
| S0 | S0_HALF | F0 | X0 | F1 | X1 |
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

The output terminals X1, F0, X0, and F1 are electrically-coupled to the incremental delay circuit 204 shown in FIG. 2B through inverters INV3, INV4, INV5, and INV6, accordingly.

Referring to FIG. 2B, the incremental delay circuit 204 has a plurality of Metal Oxide Semiconductor Field Effect Transistors ("MOSFET") arranged in a switching arrangement such that the S0 signal selects either the D0 signal path, which is electrically-coupled to the input terminal 200c, or the D1 signal path, which is electrically-coupled to the input terminal 200b.

Referring briefly back to FIG. 2A, the S0_HALF signal line at input terminal 200e designates a delay path within the fine incremental delay circuit 204. With the present configuration, two delay paths are provided: a first path and a slower path. It should be noted that additional delay paths may be added with different time delay intervals to provide additional fractional delay units.

With the D0 signal line at a logic "1" voltage, the first path is designated by the logical ON voltage states of pMOS transistors Q1 and Q2, and nMOS transistors Q4 and Q6. The slower path, the path having a greater time delay than the first path, is designated by the logical "1" voltage states of pMOS transistors Q1 and Q3, and nMOS transistors Q5 and Q6.

As mentioned briefly above, the physical characteristics of a semiconductor device determine speed of operation of the device. The time delay values of individual devices in the present invention are provided by adjusting the channel width of the device in the design and semiconductor fabrication process.

A transistor channel is a conductive portion of the semiconductor device that is eventually formed by the application of a gate voltage in the section of the transistor device between the drain and the source diffusion regions of a transistor. The distance between the drain and the source diffusion regions of a transistor is the channel length L, and the lateral extent of the channel—perpendicular to the length dimension—is the channel width W.

The transistors in the first delay path are devices having larger transistor channel widths than the slower path. These devices may be sized such that the delay of the slower path is about one-half a coarse unit delay slower than the first path. Accordingly, for the present embodiment of the invention, the transistor channel sizes is: $W_{Q2} > W_{Q3}$; $W_{Q4} > W_{Q5}$; $W_{Q8} > W_{Q9}$; and $W_{Q10} > W_{Q11}$.

For convenience in delay standards, the first delay path has about the same delay as one of the inverting delay blocks 102, 104, 106, 108, 110, 112, or 114. It should be noted, however, the first path may have a delay value less than or greater than that of the inverting delay blocks as needed. Accordingly, the circuit operates as follows:

TABLE 2

| INPUT | | OUTPUT | |
|---|---|---|---|
| S0 | S0_HALF | Selected Data on Output 200a | Delay Path |
| 0 | 0 | D0 | First |
| 0 | 1 | D0 | Slower |
| 1 | 0 | D1 | First |
| 1 | 1 | D1 | Slower |

The delay through fine delay element 200 is established by the selected one of the parallel paths through the delay block (i.e., MUX) 200, as described above. Note that for FDE 200 to increase the delay does not involve increasing a number of delay blocks in series, as is the case with delay blocks (i.e., MUX's) 102/114, 104/112, and 106/110 in the coarse delay element 115. (Herein following, a delay block pair in the CDE 115, such as 102/114, may be referred to as a "CDE delay element." Such a CDE delay element introduces an associated signal delay in an amount that will be referred to herein as a "delay unit." That is, the increments by which delay may be increased by the CDE are increments of one delay unit. Likewise, the minimum delay state of the CDE, i.e., the delay introduced by one such CDE delay element, is a delay unit.) Note also that it may be selected for the delay circuitry 100 to generate an output in response to the DATA_IN signal by propagating the DATA_IN signal to the DATA_OUT line 200a solely through the FDE 200, which has at least one signal propagation path with a shorter associated delay than one of the "delay units" established by the CDE delay elements. It follows, accordingly, that the minimum delay state of the FDE 200, and hence the overall delay circuitry 100, (also referred to as "insertion delay") is smaller than one of the CDE established "delay units." If at least two of the selectable paths through the FDE 200 have delays shorter than that of the CDE delay units, it also follows that the minimum increment of increase in delay of the delay circuitry 100 is shorter than one of the delay units.

Figure 3:
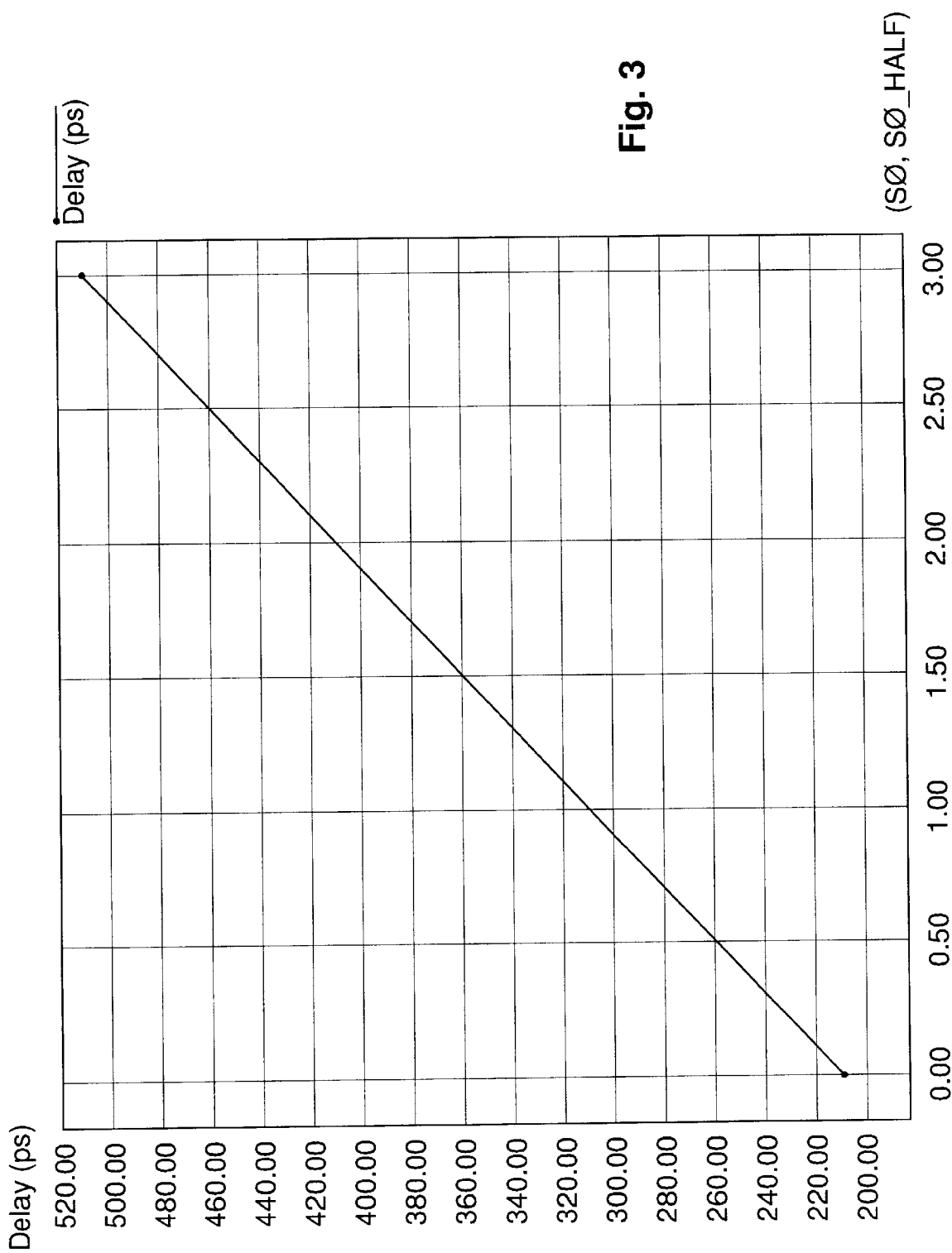
FIG. 3 is an x-y plot diagram of the delay intervals available from the programmable delay element of the present invention with respect to the input selections from the control circuit of the present invention.

Referring to FIG. 3, shown is an x-y plot with respect to delay increases from the binary values selected through S0 and S0_HALF signal lines for the fine delay element 200. For example, when the S0 and S0_HALF signal lines are at a logic "0" voltage level, the amount of delay is about 210 picoseconds. When the S0 signal line is at a logic "0" voltage level and the S0_HALF signal line is at a logic "1" voltage level, the amount of delay is about 310 picoseconds.

When the S0 signal line is at a logic "1" voltage level and the S0_HALF signal line is at a logic "0" voltage level, the amount of delay is about 410 picoseconds. When the S0 and the S0_HALF signal lines are at a logic "1" voltage level, the amount of delay is about 510 picoseconds. It should be readily appreciated by those skilled in the art that other delay values may be generated by adjusting the structures of the individual the transistors accordingly.

The present invention as shown with respect to the FIGURES is a stuck-at fault testable circuit because the first and the slower paths are independently controllable without using parallel circuit paths. That is, stuck-at faults may be detected with either a source current ("Idd") test or a direct-current voltage test. In other words, if a path is an "open circuit" in which a conductor continuity has been compromised through a break, crack, or other condition that interrupts the electrical flow through the circuit, the direct-current voltage test may be used.

For comparison, a non-stuck-at testable circuit structure uses a capacitor structure to control fine delay adjustment. In such structures, if the capacitor is an "open circuit," the circuit would continue to function logically correct, but without the delay that would have been created by the capacitor structure. Accordingly, detection of the fault is difficult. Further, direct-current testing methods cannot be used, requiring open circuit fault detection using alternating-current testing methods, which are imprecise and expensive.

Another advantage of the present invention is the improved circuit modeling accuracy due to the use of device current for delay variation instead of the conventional approach of using a capacitor structure.

Figure 4:
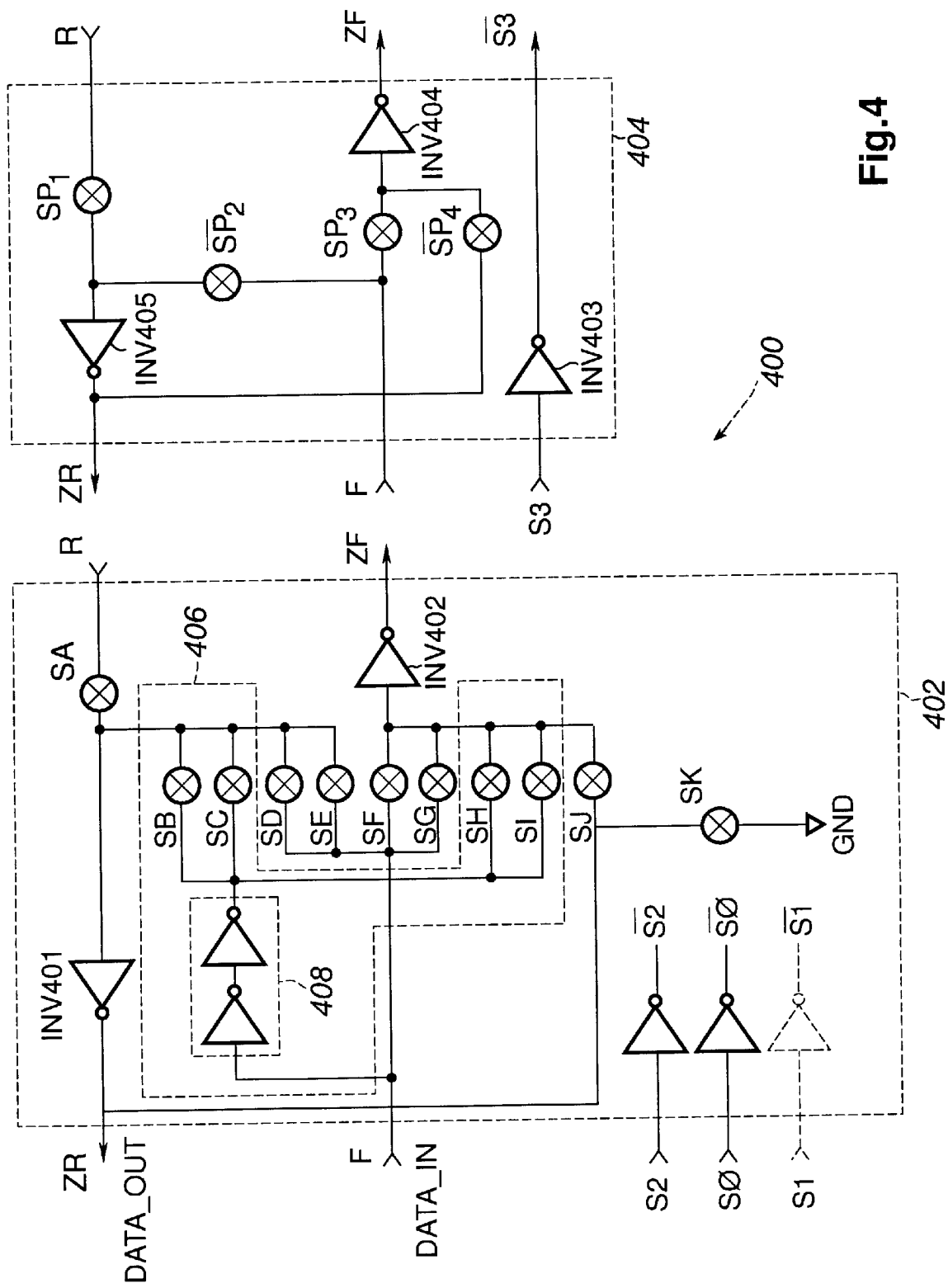
FIG. 4 is a logic level schematic of the programmable delay element of the present invention embodied in passgate-transistor technology.
Figure 5:
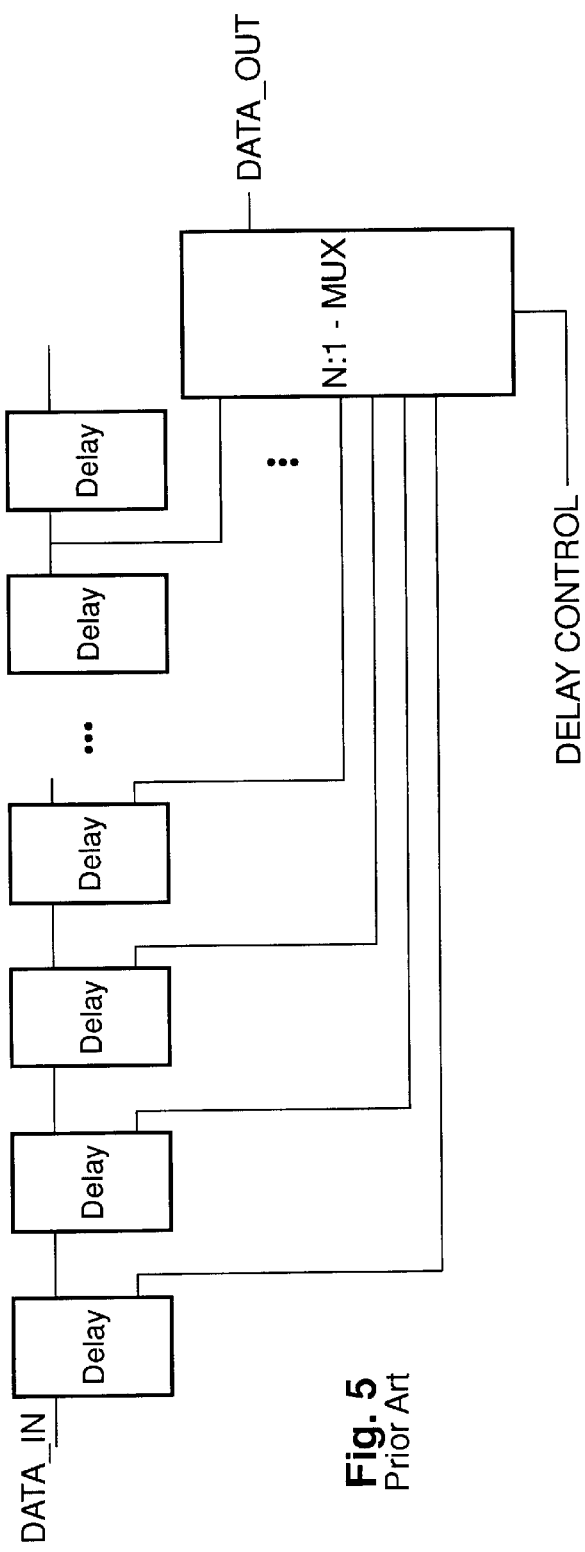
FIG. 5 is a prior art delay element with one logic block of delay resolution.
Figure 6:
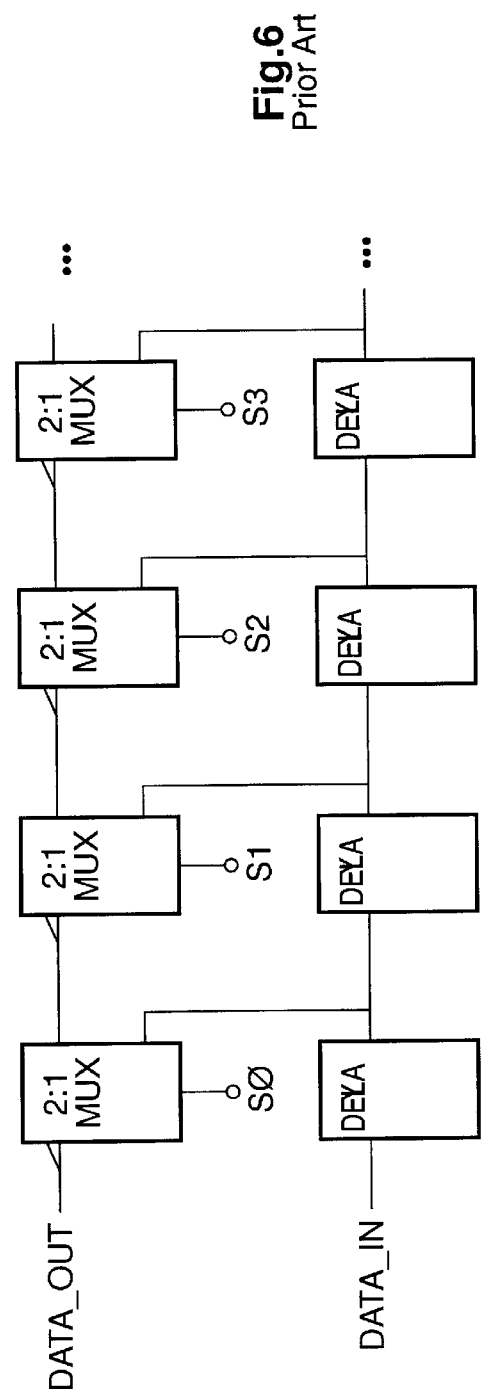
FIG. 6 is a prior art delay element with two logic blocks of delay resolution.

FIG. 4 is a component level schematic showing the use of passgate transistor technology, which allows data transfer at high rates of speeds between circuit components. Such high data transfer rates are particularly important where timing is critical. Passgate technology is known to those skilled in the art. An example of passgate technology is provided by U.S. Pat. No. 5,777,504, issued Jul. 7, 1998, to Chu et al., which is incorporated by reference herein.

In FIG. 4 the programmable delay element 400 includes a passgate-based fine delay element circuit 402 that is electrically-coupled to a coarse delay element circuit 404.

The fine-delay element circuit 402 has a base fine-delay portion provided with passgate transistors SA, SD, SE, SF, SG, SJ, and SK. A finer-delay portion 406 is provided by passgate transistors SB, SC, SH, and SI, and inverter delay block 408. The finer-delay portion 406 is deployed when finer increments of additional delay are needed. In this regard, it is appreciated by those of skill in the art that further units of fine delay may be provided to the fine delay circuit 402, and that the finer-delay portion 406 is provided as an example to achieve that end.

Input line F is coupled to a DATA_IN signal to be acted on by the programmable delay element 400. The delayed output is provided through the output line ZR with a DATA_OUT signal. Signal buffers are provided with the inverters INV401 and INV402.

The base fine-delay portion of the fine delay circuit 402 is programmable or controllable through the control lines S0 and S2. The control line S0 selects either a first delay path or a slower delay path. A logic "0" level selects a first delay path, and a logic "1" level selects a slower delay path through the base fine-delay portion. It should be noted, however, that the control logic can be configured to deploy other logic control technologies.

The control line S2 selects the data path. For example, a logic "0" level provides a data path through the fine-delay element 402; a logic "1" level provides a data path through the fine-delay element 402 and the coarse-delay element 404.

It is understood that the passage transistors are activated through their respective gate terminals. Accordingly, the logic for selecting a data path through a predetermined sequence of passgate transistors for the fine delay element 402, without the finer-delay element 406, is as follows in TABLE 3:

TABLE 3

| Passgate Transistor Active | Control Signal Line Logic |
|---|---|
| SA | S2 |
| SD | $\overline{S2} \wedge \overline{S0}$ |
| SE | $\overline{S2}$ |
| SF | S2 |
| SG | $\overline{S2} \wedge \overline{S0}$ |
| SJ | $\overline{S2}$ |
| SK | S2 |

As shown in TABLE 3, the signal line S2 is used to select the data input for the fine delay element circuit 402. That is, whether the data path through the programmable delay element 400 routed through the coarse delay element circuit 404 or routed through the fine delay circuit 402 without being routed through the coarse delay circuit 404. The data output—the delayed input signal—s provided through the signal line ZR.

The control line S1, shown in phantom lines, is used in a configuration in which the finer-delay element 406 is deployed with the fine delay element 402. With the finer-delay element 406, the delays are selectable with a logic control circuit coupled to the gate terminals of the passgate transistors. The logic of this line logic circuit is shown in the following TABLE 4:

TABLE 4

| Passgate Transistor Active | Control Signal Line Logic |
|---|---|
| SA | S2 |
| SB | $\overline{S2} \wedge S1$ |
| SC | $\overline{S2} \wedge \overline{S0} \wedge S1$ |
| SD | $\overline{S2} \wedge \overline{S0}$ |
| SE | $\overline{S2} \wedge \overline{S1}$ |
| SF | $S2 \wedge \overline{S1}$ |
| SG | $S2 \wedge \overline{S0} \wedge \overline{S1}$ |
| SH | $S2 \wedge \overline{S0} \wedge S1$ |
| SI | $S2 \wedge S1$ |
| SJ | $\overline{S2}$ |
| SK | S2 |

Still referring to FIG. 4, the coarse delay element circuit 404 has a plurality of passgate transistors $SP_1$, $\overline{SP_2}$, $SP_3$, and $\overline{SP_4}$, which are nMOS logic transistors, and passgate transistors $\overline{SP}$, which are pMOS logic transistors. The input control line S3 is coupled to the gate terminals of the transistors SP for selecting the data path through the coarse delay element circuit 404. Buffers are provided by inverter circuits INV404 and INV405.

The time delay values for each of the passgate transistors SA through SK, and the transistors $SP_1$, $\overline{SP_2}$, $SP_3$, and $\overline{SP_4}$, can be provided through design of the transistor channel width for each device, as is discussed above in detail. In this manner, a programmable delay element 400 can be provided with a set of known delay values for use in an electrical circuit. Furthermore, a microprocessor, microcontroller, delay locked loop, or other form of delay-feedback circuit can be coupled to the control lines S0, S2, and S3, and the control line S1 when the finer-delay circuit 406 is used, to programmably-control the amount of delay for a DATA_IN signal as necessary.

Although the present invention and its advantages have been described in detail, it should be understood that various changes, substitutions and alterations can be made herein without departing from the spirit and scope of the invention as defined by the appended claims.

What is claimed is:

1. Circuitry for delaying a signal, comprising:
   a coarse delay element (CDE) coupled to a delay circuitry input node for receiving a delay circuitry input signal, and having an output node for outputting a CDE output signal, wherein the CDE receives at least one CDE control signal for selecting a CDE delay time, the CDE output signal being responsive to the delay circuitry input signal, and delayed with respect to the delay circuitry input signal according to the selected CDE delay time;
   a fine delay element (FDE) coupled to the delay circuitry input node for receiving the delay circuitry input signal, coupled to the CDE output node for receiving the CDE output signal, and having an output node for outputting an FDE output signal, wherein the FDE receives at least one FDE control signal for selecting i) an FDE delay time, and ii) an operative FDE input signal, from the delay circuitry input signal and the CDE output signal, the FDE output signal being responsive to the operative FDE input signal, and delayed with respect to the operative FDE input signal according to the selected FDE delay time.

2. The circuitry of claim 1, wherein the CDE has at least first and second selectable CDE signal propagation paths through the CDE, the first CDE signal propagation path having a first CDE delay element, and the second CDE signal propagation path having the first CDE delay element in series with a second CDE delay element, the first CDE signal propagation path being selected for a first, relatively short, CDE delay time, and the second CDE signal propagation path being selected for a second, relatively longer, CDE delay time; and
   wherein the FDE has at least first and second FDE signal propagation paths through the FDE, the first FDE signal propagation path having a first FDE delay element, and the second FDE signal propagation path having a second FDE delay element, exclusive of the first FDE delay element, the first FDE signal propagation path being selected for a first, relatively short, FDE delay time, and the second FDE signal propagation path being selected for a second, relatively longer, FDE delay time.

3. The circuitry of claim 2, wherein the first FDE delay element has a transistor of a first channel size, and the second FDE delay element has a transistor of a second channel size, the first channel size being larger than the second channel size.

4. A method for delaying a signal, comprising the steps of:
   a) receiving a delay circuitry input signal by a coarse delay element (CDE);
   b) selecting a CDE delay time by at least one CDE control signal;
   c) outputting a CDE output signal, by the CDE, responsive to the delay circuitry input signal, and delayed with respect to the input signal according to the selected CDE delay time;
   d) receiving the delay circuitry input signal by a fine delay element (FDE);
   e) receiving the CDE output signal by the FDE;
   f) selecting the delay circuitry input signal or the CDE output signal as an operative FDE input signal by at least one FDE control signal;
   g) selecting an FDE delay time by at least one FDE control signal; and
   h) outputting an FDE output signal responsive to the operative FDE input signal, and delayed with respect to the operative FDE input signal according to the selected FDE delay time.

5. The method of claim 4, wherein step b) comprises:
   b1) selecting a signal propagation path through the CDE, wherein selecting a relatively short, first CDE delay time selects a first CDE delay element for the CDE signal propagation path, and selecting a relatively longer, second CDE delay time adds a second delay element to the first CDE delay element in the CDE signal propagation path;
   and step g) comprises:
   g1) selecting a signal propagation path through the FDE, wherein selecting a relatively short, first FDE delay time selects a first FDE delay element for the FDE signal propagation path, and selecting a relatively longer, second FDE delay time selects a second FDE delay element for, and excludes the first FDE delay element from, the CDE signal propagation path.

6. The method of claim 5, wherein the first FDE delay element has a transistor of a first channel size, and the second FDE delay element has a transistor of a second channel size, the first channel size being larger than the second channel size.

7. A programmable delay element for providing a selectable line delay, the programmable delay element comprising:
- a coarse delay circuit having plurality of selectable delay blocks in a repetitive block configuration for providing a selectable coarse delay path, said coarse delay circuit electrically-coupled to a source terminal for receiving and delaying a signal through said selectable coarse delay path, each delay block of said plurality of selectable delay blocks having an associated unit of delay for providing a coarse delay output signal;
- a fine delay circuit having a fractional delay of said associated unit of delay, said fine delay circuit electrically-coupled to an output of said plurality of selectable delay blocks for further delaying said coarse delay output signal by said at least one fractional delay of said associated unit of delay; and
- control circuitry coupled to said plurality of selectable delay blocks and said fine delay block such that a cumulative delay can be selected for said signal.

8. The programmable delay element of claim 7 wherein said fine delay is electrically-coupled to said source terminal, said control circuitry selecting either said source terminal or said output of said plurality of selectable delay blocks.

9. The programmable delay element of claim 7 wherein said fine delay circuit further comprises:
- a plurality of selective delay paths, each of said delay paths having an increasingly greater delay time interval such that an aggregate of each delay path of said plurality of selective delay paths is a unit of delay, each delay path of said plurality of selective delay paths controllable by said control circuitry, whereby said signal is correspondingly delayed through said plurality of selective delay paths.

10. The programmable delay element of claim 9 wherein said fine delay is electrically-coupled to said source terminal, said control circuitry selecting either said source terminal or said output of said plurality of selectable delay blocks.

11. The programmable delay element of claim 10 wherein said fine delay is electrically-coupled to said source terminal, said control circuitry selecting either said source terminal or said output of said plurality of selectable delay blocks to further delay either said signal or said coarse delay output signal by said at least one fractional delay of said associated unit of delay.

12. A programmable delay circuit for a high-speed computer system, the programmable delay circuit comprising:
- means for finely delaying an input signal by a fraction of a unit of delay;
- control circuitry coupled to said fine delay means for adjusting a cumulative delay value of said fraction of said unit of delay through said fine delay means in response to an input code provide to said control circuitry; and
- means for coarsely delaying said input signal, said coarse delay means coupled to said fine delay means such that an output signal of said coarse delay means can be further delayed through said fine delay means,
- wherein said fine delay means receives said input signal and said output signal of said coarse delay means, said input code to said control circuitry selecting either said input signal or said output signal of said coarse delay means for routing through said fine delay means.

13. The programmable delay element of claim 7, wherein said coarse delay circuit comprises:
- an input delay path comprising a sequence of N first delay blocks each having said associated unit of delay, first and second delay inputs, a first control input receiving a first control signal from said control circuit, and a first delay output, said input delay path receiving said signal in a first delay input of a first one of said N first delay blocks,
  - wherein each of said first delay inputs of delay blocks 2 through N is coupled to a corresponding one of said first delay outputs from a preceding first delay block in said input delay path; and
- an output delay path comprising a sequence of N−1 second delay blocks each having said associated unit of delay, third and fourth delay inputs, a second control input receiving a first control signal from said control circuit, and a second delay output,
  - wherein each of said third delay inputs of said sequence of N−1 second delay blocks in said output delay path is coupled to a corresponding one of said first delay outputs of said input delay path and each of said fourth delay inputs is coupled to a corresponding second delay output from a preceding one of said N−1 second delay blocks in said output delay path,
- and wherein said first delay output of said N first delay block remains un-coupled, said fourth delay input of said N−1 second delay block is coupled to a power supply voltage, and said second delay output of said first of N−1 second delay blocks generates said coarse delay output signal.

14. The programmable delay element of claim 13, wherein said first delay block comprises:
- a first delay circuit having said first delay input for receiving a first delay input signal and coupling inverted transition states of said first delay input signal to a first output node in response to a first logic state of said first control signal and isolating transition states of said first delay input signal from said first output node in response to a second state of said first control signal; and
- a second delay circuit having said second delay input for receiving a second delay input signal at said second delay input and coupling inverted transition states of said second delay input signal to said first output node in response to said second logic state of said first control signal and isolating transition states of said second signal from said first output node in response to said first state of said first control signal, wherein said first control signal is set to said first state and said first output node generates a first coarse delay output signal corresponding to said first delay input signal and having transitions delayed said associated unit of delay.

15. The programmable delay element of claim 13, wherein said second delay block comprises:
- a first delay circuit having said third delay input for receiving a first delay input signal and coupling inverted transition states of said first delay input signal to a first output node in response to a first logic state of said second control signal and isolating transition states of said first delay input signal from said first output node in response to a second state of said first control signal; and a second delay circuit having said fourth delay input for receiving a second delay input signal at said second delay input and coupling inverted transition states of said second delay input signal to said first output node in response to said second logic state of said second control signal and isolating transition states of said second signal from said first output node in response to said first state of said second control signal, wherein said first output node generates a first coarse delay output signal corresponding to a selected one of said first and second delay input signals having transitions delayed said associated unit of delay in response to logic states of said second control signal.

16. The programmable delay element of claim 14, wherein said first delay circuit comprises:

first circuitry for receiving said first delay input signal, inverting a first logic state of said first delay input signal and coupling said first inverted logic state of said first delay input signal to a first signal node and inverting a second logic state of said first delay input signal and coupling said second inverted logic state of said first input signal to a second signal node; and second circuitry for coupling said first and second signal nodes to said first output node generating inverted logic transition states of said first delay input signal delayed said associated unit of delay in response to a first state of said first control signal.

17. The programmable delay element of claim 14, wherein said second delay circuit comprises:

first circuitry for receiving said second delay input signal, inverting a first logic state of said second delay input signal and coupling said first inverted logic state of said second input signal to a third signal node and inverting a second logic state of said second delay input signal and coupling said second inverted logic state of said second input signal to a fourth signal node; and second circuitry for coupling said third and fourth signal nodes to said first output node generating inverted logic transition states of said second delay input signal delayed said associated unit of delay in response to a second state of said first control signal.

18. The programmable delay element of claim 16, wherein said first circuitry comprises:

a P channel field effect transistor (PFET) receiving said first delay input signal at a first gate terminal, receiving a first power supply voltage at a first source terminal and inverting a first logic state of said first delay input signal and coupling said first inverted logic state of said first delay input signal to a first drain terminal in response to a first state of said first signal, said first drain terminal corresponding to said first signal node; and an N channel field effect transistor (NFET) receiving said first delay input signal at a second gate terminal, receiving a second power supply voltage at a second source terminal and inverting said second logic state of said first delay input signal and coupling said second inverted logic state of said first input signal to a second drain terminal in response to a second state of said first delay input signal, said second drain terminal corresponding to second signal node.

19. The programmable delay element of claim 16, wherein said second circuitry comprises:

a PFET having a first gate terminal receiving said first control signal, a first source terminal coupled to said first signal node and a first drain terminal coupled to said first output node; and an NFET having a second gate terminal receiving a logic inversion of said first control signal, a second source terminal coupled to said second signal node and a second drain terminal coupled to said first output node, wherein said PFET and NFET couple said first and second signal nodes to said first output node generating inverted logic transition states of said first delay input signal delayed said associated unit of delay in response to said first state of said first control signal.

20. The programmable delay element of claim 17, wherein said first circuitry comprises:

a P channel field effect transistor (PFET) receiving said first delay input signal at a first gate terminal, receiving a first power supply voltage at a first source terminal and inverting a first logic state of said first delay input signal and coupling said first inverted logic state of said first delay input signal to a first drain terminal in response to a first state of said first signal, said first drain terminal corresponding to said first signal node; and an N channel field effect transistor (NFET) receiving said first delay input signal at a second gate terminal, receiving a second power supply voltage at a second source terminal and inverting said second logic state of said first delay input signal and coupling said second inverted logic state of said first delay input signal to a second drain terminal in response to a second state of said first delay input signal, said second drain terminal corresponding to said second signal node.

21. The programmable delay element of claim 17, wherein said second circuitry comprises:

a PFET having a first gate terminal receiving said first control signal, a first source terminal coupled to said first signal node and a first drain terminal coupled to said first output node; and an NFET having a second gate terminal receiving a logic inversion of said first control signal, a second source terminal coupled to said second signal node and a second drain terminal coupled to said first output node, wherein said PFET and NFET couple said first and second signal nodes to said first output node generating inverted logic transition states of said first delay input signal delayed said associated unit of delay in response to said first state of said first control signal.

22. The programmable delay element of claim 7, wherein said fine delay circuit comprises:

first circuitry for receiving a fine delay input signal, inverting a first logic state of said fine delay input signal and coupling said first inverted logic state of said fine delay input signal to a first signal node and inverting a second logic state of said fine delay input signal and coupling said second inverted logic state of fine delay input signal to a second signal node;

second circuitry for coupling said first and second signal nodes to said first output node generating inverted logic transition states of said fine delay input signal delayed said fractional delay of said associated unit of delay in response to first and second control signals received from said control circuitry;

third circuitry for receiving a second fine delay input signal, inverting a first logic state of said second fine delay input signal and coupling said first inverted logic state of said second fine delay input signal to a third signal node and inverting a second logic state of said second fine delay input signal and coupling said second inverted logic state of second fine delay input signal to a fourth signal node; and fourth circuitry for coupling said third and fourth signal nodes to said first output node generating inverted logic transition states of said second fine delay input signal delayed said fractional delay of said associated unit of delay in response to third and fourth control signals received from said control circuitry.

23. The programmable delay element of claim 22, wherein said fine delay circuit further comprises:

fifth circuitry for coupling said first and second signal nodes to said first output node generating inverted logic transition states of said fine delay input signal delayed said second fractional delay of said associated unit of delay in response to fifth and sixth control signals received from said control circuitry; and sixth circuitry for coupling said third and fourth signal nodes to said first output node generating inverted logic transition states of said second fine delay input signal delayed said second fractional delay of said associated unit of delay in response to seventh and eighth control signals received from said control circuitry.

24. The programmable delay element of claim 22, wherein said first circuitry comprises:

a P channel field effect transistor (PFET) receiving said fine delay input signal at a first gate terminal, receiving a first power supply voltage at a first source terminal and inverting a first logic state of said fine delay input signal and coupling said first inverted logic state of said fine delay input signal to a first drain terminal in response to a first state of said fine delay input signal, said first drain terminal corresponding to said first signal node; and an N channel field effect transistor (NFET) receiving said fine delay input signal at a second gate terminal, receiving a second power supply voltage at a second source terminal and inverting said second logic state of said fine delay input signal and coupling said second inverted logic state of said fine delay input signal to a second drain terminal in response to a second state of said fine delay input signal, said second drain terminal corresponding to second signal node.

25. The programmable delay element of claim 22, wherein said second circuitry comprises:

a PFET having a first gate terminal receiving said first control signal, a first source terminal coupled to said first signal node and a first drain terminal coupled to said first output node; and an NFET having a second gate terminal receiving said second control signal, a second source terminal coupled to said second signal node and a second drain terminal coupled to said first output node, wherein said PFET and NFET couple said first and second signal nodes to said first output node generating inverted logic transition states of said fine delay input signal delayed said fractional delay of said associated unit of delay in response to said first and second control signals.

26. The programmable delay element of claim 23, wherein said fifth circuitry comprises:

a PFET having a first gate terminal receiving said fifth control signal, a first source terminal coupled to said first signal node and a first drain terminal coupled to said first output node; and an NFET having a second gate terminal receiving said sixth control signal, a second source terminal coupled to said second signal node and a second drain terminal coupled to said first output node, wherein said PFET and NFET couple said first and second signal nodes to said first output node generating inverted logic transition states of said fine delay input signal delayed said second fractional delay of said associated unit of delay in response to said fifth and sixth control signals.

27. The programmable delay element of claim 23, wherein said sixth circuitry comprises:

a PFET having a first gate terminal receiving said seventh control signal, a first source terminal coupled to said third signal node and a first drain terminal coupled to said first output node; and an NFET having a second gate terminal receiving said eighth control signal, a second source terminal coupled to said fourth signal node and a second drain terminal coupled to said first output node, wherein said PFET and NFET couple said third and fourth signal nodes to said first output node generating inverted logic transition states of said second fine delay input signal delayed said second fractional delay of said associated unit of delay in response to said seventh and eighth control signals.

* * * * *